US009246511B2

(12) United States Patent
Kipnis et al.

(10) Patent No.: US 9,246,511 B2
(45) Date of Patent: Jan. 26, 2016

(54) METHOD AND APPARATUS TO PROCESS DATA BASED UPON ESTIMATED COMPRESSIBILITY OF THE DATA

(75) Inventors: Alon Kipnis, Be'er Sheva (IL); Itai Dror, Omer (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 13/425,016

(22) Filed: Mar. 20, 2012

(65) Prior Publication Data

US 2013/0254441 A1 Sep. 26, 2013

(51) Int. Cl.
| | | |
|---|---|---|
| *G06F 3/00* | (2006.01) | |
| *H03M 7/30* | (2006.01) | |
| *H04L 29/06* | (2006.01) | |

(52) U.S. Cl.
CPC .............. *H03M 7/30* (2013.01); *H03M 7/3071* (2013.01); *H03M 7/3079* (2013.01); *H04L 69/04* (2013.01)

(58) Field of Classification Search
None
See application file for complete search history.

(56) References Cited

U.S. PATENT DOCUMENTS

| | | | | |
|---|---|---|---|---|
| 5,049,881 A | * | 9/1991 | Gibson et al. | 341/95 |
| 5,371,499 A | * | 12/1994 | Graybill et al. | 341/51 |
| 5,406,278 A | * | 4/1995 | Graybill et al. | 341/51 |
| 5,526,363 A | * | 6/1996 | Weiss et al. | 370/477 |
| 6,236,341 B1 | * | 5/2001 | Dorward et al. | 341/60 |
| 7,200,603 B1 | * | 4/2007 | Hitz et al. | 1/1 |
| 7,567,188 B1 | * | 7/2009 | Anglin et al. | 341/63 |
| 7,814,284 B1 | * | 10/2010 | Glass et al. | 711/154 |
| 7,924,843 B2 | | 4/2011 | Matias et al. | 370/393 |
| 8,560,918 B1 | * | 10/2013 | Yang | 714/758 |
| 8,595,198 B1 | * | 11/2013 | Chamness | 707/693 |
| 8,750,370 B2 | * | 6/2014 | Nagapudi | H04L 45/745 375/240.02 |
| 2002/0122566 A1 | * | 9/2002 | Keating et al. | 382/100 |
| 2003/0007695 A1 | * | 1/2003 | Bossut et al. | 382/239 |
| 2005/0131867 A1 | * | 6/2005 | Wilson | 707/3 |
| 2005/0280841 A1 | * | 12/2005 | Bossut et al. | 358/1.2 |
| 2007/0220220 A1 | | 9/2007 | Ziv et al. | 711/159 |
| 2008/0133561 A1 | * | 6/2008 | Dubnicki et al. | 707/101 |
| 2009/0070356 A1 | * | 3/2009 | Mimatsu | 707/101 |
| 2010/0088277 A1 | * | 4/2010 | Rao et al. | 707/637 |
| 2010/0103953 A1 | * | 4/2010 | Matias et al. | 370/477 |
| 2010/0123607 A1 | * | 5/2010 | He et al. | 341/51 |
| 2010/0188273 A1 | * | 7/2010 | He et al. | 341/87 |
| 2010/0274772 A1 | * | 10/2010 | Samuels | 707/693 |
| 2010/0281340 A1 | * | 11/2010 | Franceschini et al. | 714/763 |
| 2011/0055174 A1 | | 3/2011 | Popovski et al. | 707/693 |
| 2011/0154158 A1 | * | 6/2011 | Yurzola et al. | 714/758 |

(Continued)

FOREIGN PATENT DOCUMENTS

EP          1258998 A2 * 11/2002

OTHER PUBLICATIONS

'A Comparative Experimental Study of Hash Functions Applied to Packet Sampling' by M. Molina et al., from ITC-19, 2005.*

(Continued)

*Primary Examiner* — Steven Snyder
(74) *Attorney, Agent, or Firm* — Toler Law Group, PC (57) ABSTRACT

A method includes, in a data storage device, determining an estimated compression ratio. The estimated compression ratio is based on hash values of a subset of a data set. The method includes selectively processing the data set based on the estimated compression ratio prior to storage of data associated with the data set in a memory of the data storage device.

20 Claims, 5 Drawing Sheets

(56) References Cited

U.S. PATENT DOCUMENTS

2011/0154160 A1* 6/2011 Yurzola et al. ............... 714/763
2013/0198148 A1* 8/2013 Chambliss et al. ........... 707/692

OTHER PUBLICATIONS

'Structured Computer Organization' Second Edition, by Andrew S. Tanenbaum, copyright 1984, pp. 10-11.*
'A Family of Fast Syndrome Based Cryptographic Hash Functions' by Augot et al., copyright Springer-Verlag Berlin Heidelberg 2005.*
'Lossless Compression of Digital Audio' by Mat Hans and Ronald W. Schafer, IEEE Signal Processing Magazine, Jul. 2001.*
'Quick Estimation of Data Compression and De-Duplication for Large Storage Systems' by Cornel Constantinescu and Maohua Lu, Proceedings of the 1st International Conference on Data Compression, Communication and Processing, Jun. 22, 2011.*
'Combined Data Compression and Error Correction' by S. Sudhan and M. A. Ambroze, Advances in Communications, Computing, Networks and Security vol. 7, 2010.*
'Statistical Measures as Predictors of Compression Savings' Senior Honors Thesis to fulfill the requirements of Graduation with Distinction by William Culhane, The Ohio State University, May 2008.*
'Estimation of Deduplication Ratios in Large Data Sets' by Danny Harnik et al., copyright 2012.*
'Relationship Between Entropy and Test Data Compression' by Kedarnath J. Balakrishnan and Nur A. Touba, IEEE Transactions on Computer-Aided Design of Integrated Circuits and Systems, vol. 26, No. 2, Feb. 2007.*
'Revisions to How to efficiently predict if data is compressible' by Stack Overflow, multiple publish dates, acquired by the examiner on Jul. 15, 2015.*
Gailly et al., "Zlib", Zlib Home Site, https://web.archive.org/web/20111111102615/zlib.net/, printed Jan. 31, 2015, 4 pages.
Lempel et al., "On the Complexity of Finite Sequences", IEEE Transactions on Information Theory, vol. IT-22, No. 1, Jan. 1976, p. 75-81.
Raskhodnikova et al., "Sublinear Algorithms for Approximating String Compressibility", 10th International Workshop, Approx 2007, and 11th International Workshop, Random 2007, Princeton, NJ, USA, Aug. 20-22, 2007, pp. 609-623.
Ziv et al., "A Universal Algorithm for Sequential Data Compression", IEEE Transactions on Information Theory, vol. IT-23, No. 3, May 1977, pp. 337-343.

* cited by examiner

METHOD AND APPARATUS TO PROCESS DATA BASED UPON ESTIMATED COMPRESSIBILITY OF THE DATA

FIELD OF THE DISCLOSURE

The present disclosure is generally related to compressibility of data and processing the data based upon an estimate of the compressibility of the data.

BACKGROUND

Non-volatile data storage devices, such as universal serial bus (USB) flash memory devices or removable storage cards, have allowed for increased portability of data and software applications. In order to efficiently utilize the memory capacity of a non-volatile data storage device, data may be compressed prior to storage.

One technique to compress data is to create a data representation from which redundant portions have been removed. For example, a data set may include a plurality of data elements in a string, and a portion of one or more of the data elements may be identical. A data representation of the data set may be formed by eliminating redundant (identical) data portions of the data set. The representation of the data set can be stored and upon request, such as a read request, the data set can be reconstituted to its original form by replacing the redundant portions that were removed in order to form the representation of the data set.

Compression of a large data set can be a time-intensive process that can consume significant computational bandwidth. In some cases, compression may not be warranted, such as instances in which the data set has only a small amount of redundancy. In such cases, compression would not significantly reduce an overall size that the representation of the data set would occupy in storage, as compared with the uncompressed data set. It would be helpful to be able to predict, in a time efficient and computationally efficient manner prior to performing the compression, whether compression of a data set would significantly reduce the memory space needed for storage.

SUMMARY

An estimated compression ratio of a data set may be determined from a subset of the data set. The subset of the data set may include data elements that are uniformly distributed across an entirety of the data set. The estimated compression ratio may be calculated based on hash values for each of the data elements of the subset of the data set. The estimated compression ratio may be determined from a count of collisions among the hash values of the subset of the data set.

The data set may be processed prior to storage in a memory of a data storage device based on the estimated compression ratio. Processing may include compression of the data set, error encoding of the data set, other processing, or a combination thereof. A decision of whether to compress the data set prior to storage may be based on a comparison of the estimated compression ratio to a threshold value. In addition or in the alternative, a type of processing to apply to the data, such as a type of compression, may be determined based on the estimated compression ratio.

DETAILED DESCRIPTION

Figure 1:
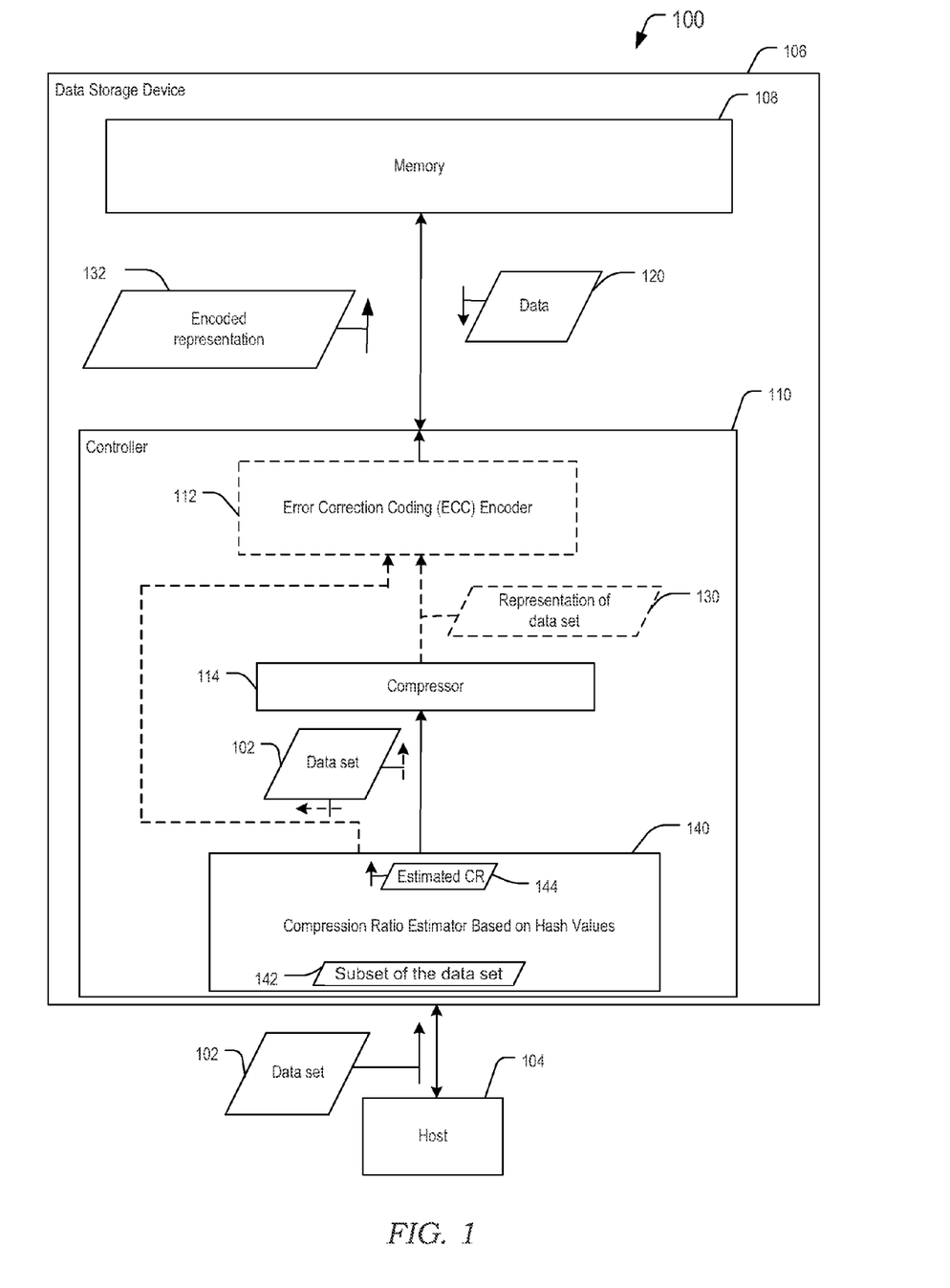
FIG. 1 is a diagram of a particular illustrative embodiment of a system including a data storage device configured to determine an estimated compression ratio and to process a data set prior to storage of the data set in memory of the data storage device.

Referring to FIG. 1, a particular embodiment of a system 100 includes a data storage device 106 coupled to a host device 104. The data storage device 106 includes a memory 108 coupled to a controller 110. The controller 110 includes processing hardware that is configured to estimate a compression ratio:

$$\text{compression ratio} = \text{compressed data size}/\text{uncompressed data size} \quad (1)$$

The estimated compression ratio is determined based on hash values of a subset 142 of a data set 102. The compression ratio is a ratio of compressed data size to uncompressed data size. The processing hardware is further configured to process the data set 102 based on the estimated compression ratio.

The host device 104 may include a mobile telephone, a music player or video player, a gaming console, an electronic book reader, a personal digital assistant (PDA), a computer, such as a laptop computer, a notebook computer, or a tablet, any other electronic device, or any combination thereof.

The memory 108 may be a non-volatile memory, such as a NAND flash memory. The data storage device 106 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 106 may be configured to be coupled to the host device 104 as embedded memory, such as eMMC® (trademark of JEDEC Solid State Technology Association, Arlington, Va.) and eSD, as illustrative examples.

The controller 110 may be configured to receive data and instructions from, and send data to, the host device 104 while the data storage device 106 is operatively coupled to the host device 104. For example, the controller 110 may receive the data set 102 from the host device 104. The controller 110 may be further configured to send data and commands to the memory 108 and to receive data 120 from the memory 108. For example, the controller 110 is configured to send data and a write command to instruct the memory 108 to store the data to a specified address. As another example, the controller 110 is configured to send a read command to read the data 120 from a specified address of the memory 108.

The controller 110 may include a compression ratio estimator 140. The compression ratio estimator 140 may be configured to determine an estimated compression ratio 144 associated with a data set, such as the data set 102, based on hash values of the subset 142 of the data set 102, as described in further detail with respect to FIG. 2. The estimated compression ratio 144 may be determined from the subset 142 of the data set 102, and the estimated compression ratio 144 may be output from the compression ratio estimator 140 to a compressor 114.

The compressor 114 may be configured to compress a data set, such as the data set 102, according to a selected compression method or according to a combination of compression methods. The compression method, if any, to be applied to the data set 102 may be selected based upon the estimated compression ratio 144. By compressing the data set 102 to form a representation 130 of the data set 102 and storing the representation 130 of the data set 102, less space may be occupied in the memory 108 than if the (uncompressed) data set 102 had been stored. In response to a read request, the representation 130 of the data set 102 may be retrieved from the memory 108 and uncompressed, e.g., by the compressor 114 or by a decompressor (not shown) within the controller 110, to yield the original data set 102. Although the compressor 114 is illustrated as included in the controller 110, in other implementations the compressor 114 may be external to the controller 110.

Optionally, the controller 110 may include an error correction coding (ECC) encoder 112. The ECC encoder 112 may be configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode according to one or more other ECC encoding schemes, or any combination thereof. The ECC encoder 112 may be configurable to apply different ECC encoding schemes based on a size of the data. For example, the ECC encoder 112 may be configurable to apply a first encoding scheme to uncompressed data, or to apply a second, more powerful encoding scheme using more parity bits, to compressed data.

In operation, the data storage device 106 may receive the data set 102 from the host 104. The data set 102 may be input to the compression ratio estimator 140. A subset 142 of the data set 102 may be formed from the data set 102. The subset 142 of the data set 102 may include fewer data elements than the total number of data elements in the data set 102. The subset 142 of the data set 102 may be formed by selecting data elements uniformly over an entirety of the data set 102. For example, when the data set 102 includes 4096 data elements, the subset 142 of the data set 102 may include every fourth data element of the data set 102, for a total of 1024 data elements in the subset 142 of the data set 102.

The estimated compression ratio 144 may be determined based upon the subset 142. Processing of the data set 102 prior to storage of the data set 102 in the memory 108 of storage device 106 may be determined based on the estimated compression ratio 144. Processing may include compression of the data set 102 and/or error correction encoding of the data set 102. For example, the compression ratio estimator 140 may determine whether to compress the data set 102 based on the estimated compression ratio 144. Also, the ECC encoder 112 may determine a type of error encoding to apply to a representation 130 of the data set 102 based on the estimated compression ratio 144.

Figure 2:
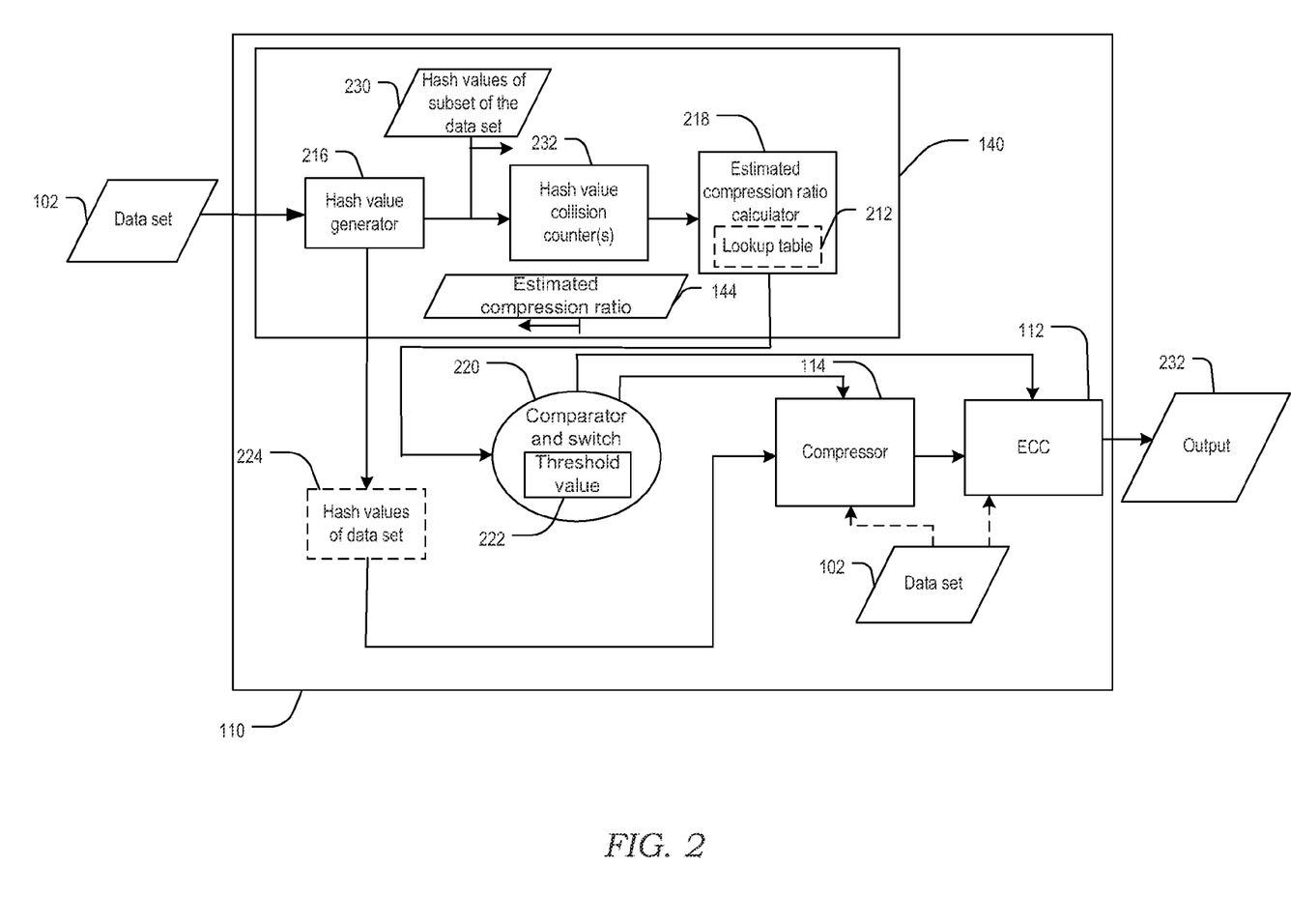
FIG. 2 is a block diagram illustrating a particular embodiment of components including a controller that may be incorporated in the data storage device of FIG. 1.

As described in further detail with respect to FIG. 2, the estimated compression ratio 144 may be compared to a threshold value in order to determine whether to compress the data set 102 prior to storage at the memory 108. In an example, in response to the estimated compression ratio satisfying the threshold value, i.e., is equal to or greater than the threshold value, compression of the data set 102 is not executed, because the (compressed) representation of the data set 102 does not result in a significant reduction in memory space needed for storage of the representation of the data set 102 as compared with storage of the data set 102. In another example, when the estimated compression ratio 144 is less than the threshold value, compression of the data set is executed to form the representation 130 of the data set 102. The representation 130 of the data set 102 may occupy a smaller portion of the memory 108 than the portion of the memory 108 that would be occupied by storing the data set 102.

The compression ratio estimator 140 may send the estimated compression ratio 144 to the compressor 114 and the compressor 114 may determine a type of compression to apply to the data set 102 based upon the estimated compression ratio 144. Compression techniques that may be applied include lossless compression (e.g., Lempel-Ziv compression), lossy compression (e.g., MPEG-2), one or more other compression techniques, or a combination thereof.

Processing may also include applying error correction to the representation 130 of the data set 102 prior to storage in the memory 108. The representation 130 of the data set 102 may be input to the ECC encoder 112 and the representation 130 of the data set 102 may be encoded with a selected error correction code encoding scheme by the ECC encoder 112. The ECC encoder 112 may receive the estimated compression ratio 144 from the compression ratio estimator 140 and the ECC encoder 112 may select a type of error correction code encoding based upon the estimated compression ratio 144. The ECC encoder 112 may output an encoded representation 132 of the representation 130 of the data set 102 for storage at the memory 108. Both the representation 130 and the encoded representation 132 comprise data associated with the data set 102.

When the comparison of the estimated compression ratio 144 to the threshold value indicates that compression is not to be initiated, the data set 102 may be directly input to the ECC encoder 112 for processing. The ECC encoder 112 may apply error encoding to each data element of the data set 102. The ECC encoder 112 may receive the estimated compression ratio 144 from the compression ratio estimator 140, and the ECC encoder 112 or the controller 110 may determine the type of error correction code encoding to be applied to the data set 102 based on the estimated compression ratio 144. The output of the ECC encoder 112 may be the encoded representation 132 of the data set 102, which may be stored in the memory 108.

Thus, the estimated compression ratio 144 determined based on evaluating hash values of a subset of the data set 102 can serve as a basis for a determination as to whether or not to compress the data set 102 to a representation 130 of the data set 102. The estimated compression ratio 144 can also serve as a basis for determining the type of error correction code encoding to apply to the data set 102, or to the representation 130 of the data set 102. Because the estimated compression ratio 144 is determined from a subset 142 of the data set 102 that has fewer elements than the data set 102, calculation of the estimated compression ratio may be faster than calculation of a compression ratio based upon all data elements of the data set 102. Further, because the compressor 114 may include circuitry to generate hash values (that can be used to determine an estimated compression ratio, a type of compression to apply to the data set 102, and/or a type of ECC encoding to apply), the compression ratio estimator 140 may be implemented using existing processing hardware for reduced cost of manufacturing and die area savings, as described in further detail with respect to FIG. 2.

Referring to FIG. 2, a particular embodiment of the controller 110 is illustrated. The controller 110 includes the compression ratio estimator 140, a comparator and switch 220, the compressor 114, and the ECC encoder 112. The compression ratio estimator 140 includes a hash value generator 216, one or more hash value collision counters 232, and an estimated compression ratio calculator 218.

The controller 110 may receive the data set 102, e.g., from a host device such as the host device 104 of FIG. 1. The data set 102 may be input to the hash value generator 216. The hash value generator 216 may generate a plurality of hash values based on the data set 102. For example, the hash value generator 216 may be configurable to generate a hash value corresponding to each data element of a subset of the data set, such as the subset 142 of the data set 102 of FIG. 1. The hash value generator 216 may also be configurable to generate additional hash values associated with the data set 102, such as hash values of each data element of the data set 102. The hash values may be generated based on a selected hash function, such as described with respect to FIG. 3.

The hash value generator 216 may output hash values 230 of the subset 142 of the data set 102. The hash values 230 of the subset 142 of the data set 102 may be input to hash value collision counter(s) 232. The hash value collision counter(s) 232 may tally all instances of collisions among the hash values 230 of the subset 142 of the data set 102. A collision refers to the presence of two identical hash values. Each of the hash value collision counters 232 may determine a count of collisions associated with a distinct hash value.

For example, when the data set 102 includes 100 data elements, a subset 142 of the data set 102 may be selected that includes 20 elements. Hash values of each of the subset 142 of the data set 102 may be calculated to produce the hash values 230 (e.g., 20 hash values) of the subset 142 of the data set 102. The hash value collision counters 232 may determine that among the 20 hash values 230 of the subset 142 of the data set 102, there are 8 distinct hash values, h(1)-h(8), of which h(1), h(2), h(3), and h(4) appear three times within the hash values 230 of the subset 142 of the data set 102. Each of h(5), h(6), h(7), and h(8) appear twice within the hash values 230 of the subset 142 of the data set 102. The hash value collision counters 232 may count the number of instances of identical hash values (collisions) for each distinct hash value. The hash value collision counters 232 may output a tally of collisions and the tally is input to the estimated compression ratio calculator 218.

The presence of identical hash values within the hash values 230 of the subset 142 of the data set 102 may indicate that at least a portion of each of the corresponding data elements are identical, and that the data set 102 can be compressed by removing the redundant portions without sacrificing information content. The estimated compression ratio calculator 218 may determine an estimated compression ratio based on the tally of hash value collisions received from the hash value collision counters 232. For example, the higher the number of collisions counted, the greater the estimated compression ratio. The counts of the collisions of the hash values 230 of the subset 142 of the data set 102 may be used to calculate the estimated compression ratio 144 of FIG. 1. For example, the estimated compression ratio may be calculated by comparing the number of collisions to an expected number of collisions in a uniform distribution of data values.

Alternatively, the estimated compression ratio may be determined by comparing a count of distinct hash values among the hash values 230 to an expected count of distinct hash values. For example, the expected number of distinct hash values (HVs) obtained in n independent draws from a total of M hash values is:

$$\text{Expected no. of distinct HVs} = M(1-((M-1)/M))^n) \quad (2)$$

The estimated compression ratio (CR) may be determined as a function $f$ of a ratio of the actual number of distinct HVs to the expected number of distinct HVs:

$$\text{Estimated CR} = f(\text{actual no. of distinct HVs/expected no. of distinct HVs}) \quad (3)$$

The estimated compression ratio calculator 218 may determine the estimated compression ratio via a lookup table 212. For example, the tally of collisions provided by the hash value collision counters 232 may correspond to a particular estimated compression ratio in the lookup table 212. Alternatively, the ratio of the number of distinct HVs to the expected number of distinct HVs has a corresponding value of an estimated compression ratio in the lookup table 212.

The estimated compression ratio 144 determined by the estimated compression ratio calculator 218 may be output to the comparator and switch 220. The comparator and switch 220 may compare the estimated compression ratio to a threshold value 222 (e.g., a threshold value corresponding to a 95% compression ratio) to determine whether compression is to be initiated. For example, when the estimated compression ratio 144 does not satisfy (i.e., is less than) the threshold value 222, the comparator and switch 220 may determine to initiate compression of the data set 102. When the comparator and switch 220 determines to initiate compression, the comparator and switch 220 may direct the data set 102 to the compressor 114 to compress the data set 102.

When the comparator and switch 220 determines to initiate compression of the data set 102, the compressor 214 may also receive the hash values 224 of the data set 102 (including hash values associated with each of the data elements of the data set 102) from the hash value generator 216 for use in compressing the data set 102. The compressor 114 may output a representation of the data set 102, such as the representation 130 of the data set 102, including compressed values of the data set 102, to the ECC encoder 112. The ECC encoder 112 may apply error encoding to the representation 130 of the data set 102. The estimated compression ratio 144 may be used by the ECC encoder 112 to determine a particular ECC encoding scheme to apply to the data set 102 to generate encoded compressed data as an output 232.

If the comparator and switch 220 determines that the estimated compression ratio 144 satisfies (i.e., is greater than or equal to) the threshold value 222, the comparator and switch 220 may determine to refrain from initiating the compression operation of the data set 102. The comparator and switch 220 may direct the data set 102 to be input to the ECC encoder 112, bypassing the compressor 114. The ECC encoder 112 encodes the data set 102, and the output 232 is an ECC encoded, uncompressed data set. The estimated compression ratio 144 may also be sent to the ECC encoder 112 and the estimated compression ratio 144 may be used to determine the type of error correction encoding to apply to the data set 102.

By initializing the ECC encoder 112 based on the estimated compression ratio 144 rather than waiting for a result of the compressor 114 before selecting an ECC scheme, an encoding latency may be reduced.

Figure 3:
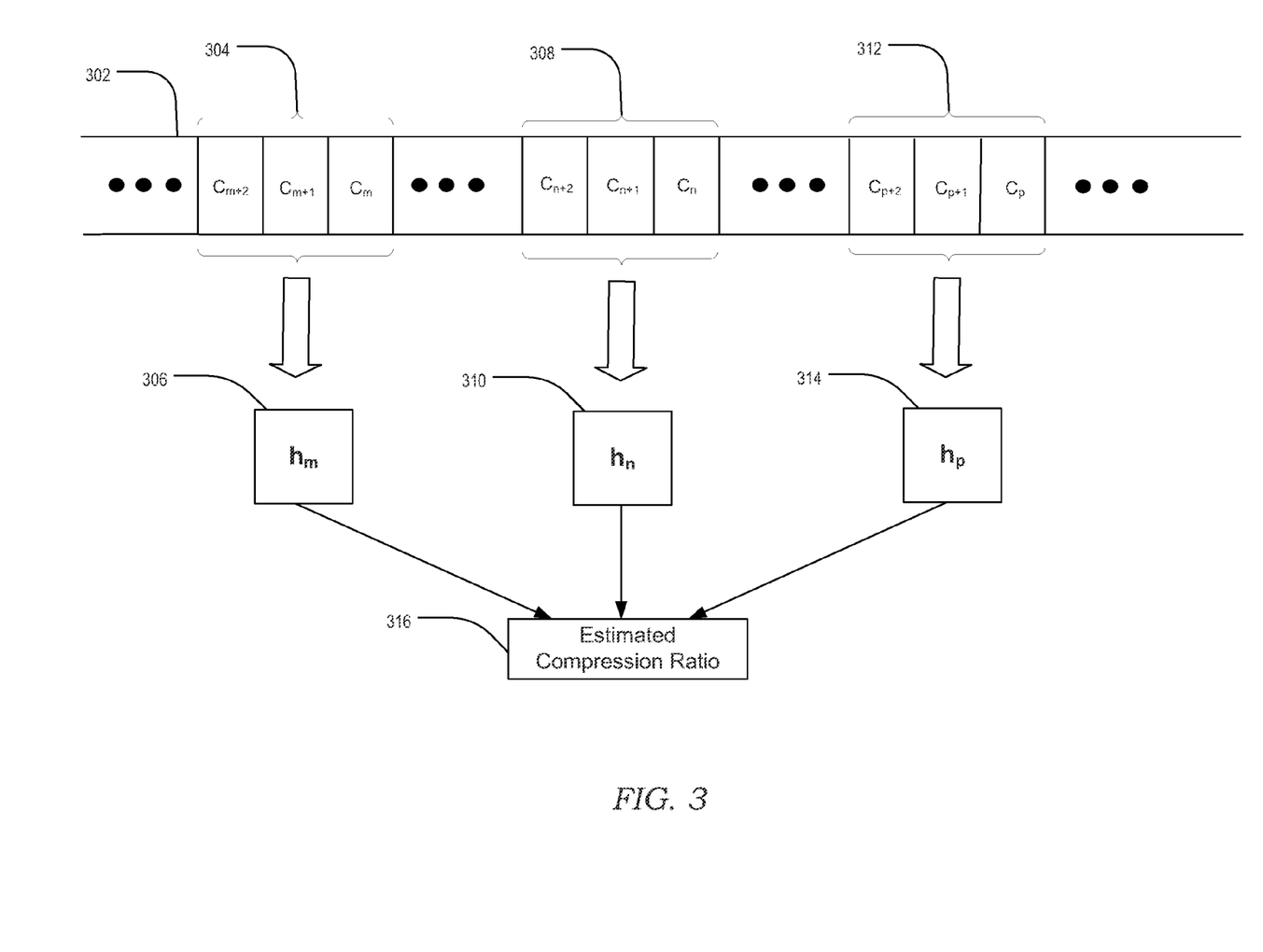
FIG. 3 is a diagram illustrating selection of a subset of a data set and a determination of hash values associated with the subset of the data set.

FIG. 3 illustrates a portion of a data set 302, such as a portion of the data set 102 of FIG. 1 and FIG. 2. The data set 302 may be a data word including a plurality of data elements. A subset of the data elements of the data set 302 may be selected to determine an estimated compression ratio. For example, the subset of the data set 302 may be selected to include data elements $C_m$, $C_n$, and $C_p$. In an embodiment, the data elements selected to be included in the subset of the data set 302 may be uniformly selected from all data elements of the data set 302. That is, the data elements selected may be equally spaced within the data set 302. In an embodiment, the data elements may be adjacent, i.e., n=m+1.

A sample 304 of the data set 302 includes data elements $C_m$, $C_{m+1}$, and $C_{m+2}$. The sample 304 may be utilized by a hash value generator, such as the hash value generator 216 of FIG. 2, to calculate a hash value $h_m$ 306 that may be associated with data element $C_m$. A sample 308 may used to calculate a hash value $h_n$ 310 associated with the data element $C_n$, and a sample 312 may used to calculate a hash value $h_p$ 314 that may be associated with the data element $C_p$. In an embodiment, the samples 308, 310, and 312 may include overlapping data elements, e.g., $C_m=C_{n+2}$. As illustrated in FIG. 3, each sample 304, 308, and 312 includes not more than three data elements. Restricting each sample to include only three data elements can result in less computing time and computing resources to determine hash values, as compared with selecting samples having a larger number of data elements per sample. In other embodiments, however, samples may be formed having a different number of data elements, and the samples may be used to calculate hash values. For example, in an embodiment, each sample may include at least two elements.

A hash value generator, such as the hash value generator 216 of FIG. 2, may generate hash values based on a selected hash function. In an embodiment, each hash value may be determined based on a corresponding sample. For example, the hash function selected for a data set that includes 4096 data elements may be:

$$h_n = [(((C_n<<4) \text{XOR } C_{n+1})<<4) \text{XOR}(C_{n+2})] \text{ \&\& 0xfff} \quad (4)$$

where << indicates a shift left operation, XOR indicates an exclusive OR operation, and && indicates a logical AND operation. By including && 0xfff in the calculation of $h_n$, the calculated value of $h_n$ includes only the 12 least significant bits.

Using the hash function (4), each hash value may be determined based on the corresponding sample, e.g., sample 304, 308, or 312. The hash function (4) may correspond to a same hash function as is commonly used in LZ-77 compression and may be implemented using processing hardware that is used in common with the compressor. In other embodiments, other hash functions may be selected and hash values may be determined based on the selected hash function.

A subset of the data set 302 may be formed by including data elements selected uniformly along the entirety of the data set 302. In other examples, the subset of the data set 302 may be selected non-uniformly within the data set 302, or may be selected from only a portion of the data set 302 such as an initial portion of the data set 302, or may be selected using a combination of selection methods.

The hash values associated with the subset of the data set 302 may be used to determine an estimated compression ratio 316 associated with the data set 302. For example, a count of hash value collisions may be determined, e.g., by hash value collision counter(s) 232 of FIG. 2. The counts of hash value collisions may be input to an estimated compression ratio calculator, such as the estimated compression ratio calculator 218 of FIG. 2, to determine the estimated compression ratio 316.

The estimated compression ratio 316 may be determined based on a comparison of the count of collisions to an expected number of collisions that is based on a uniform distribution of data values. Alternatively, the estimated compression ratio 316 can be determined as a function of a ratio of a count of distinct hash values to an expected count of distinct hash values in a total of M hash values. Using the hash values to calculate the estimated compression ratio 316 may be faster, and may require less computation, than calculating the estimated compression ratio 316 by another method, such as calculating the estimated compression ratio 316 directly from the subset of the data set 302. The techniques of determining an estimated compression ratio described with regard to the data set 302 may be applied to the data set 102 of FIG. 1.

Figure 4:
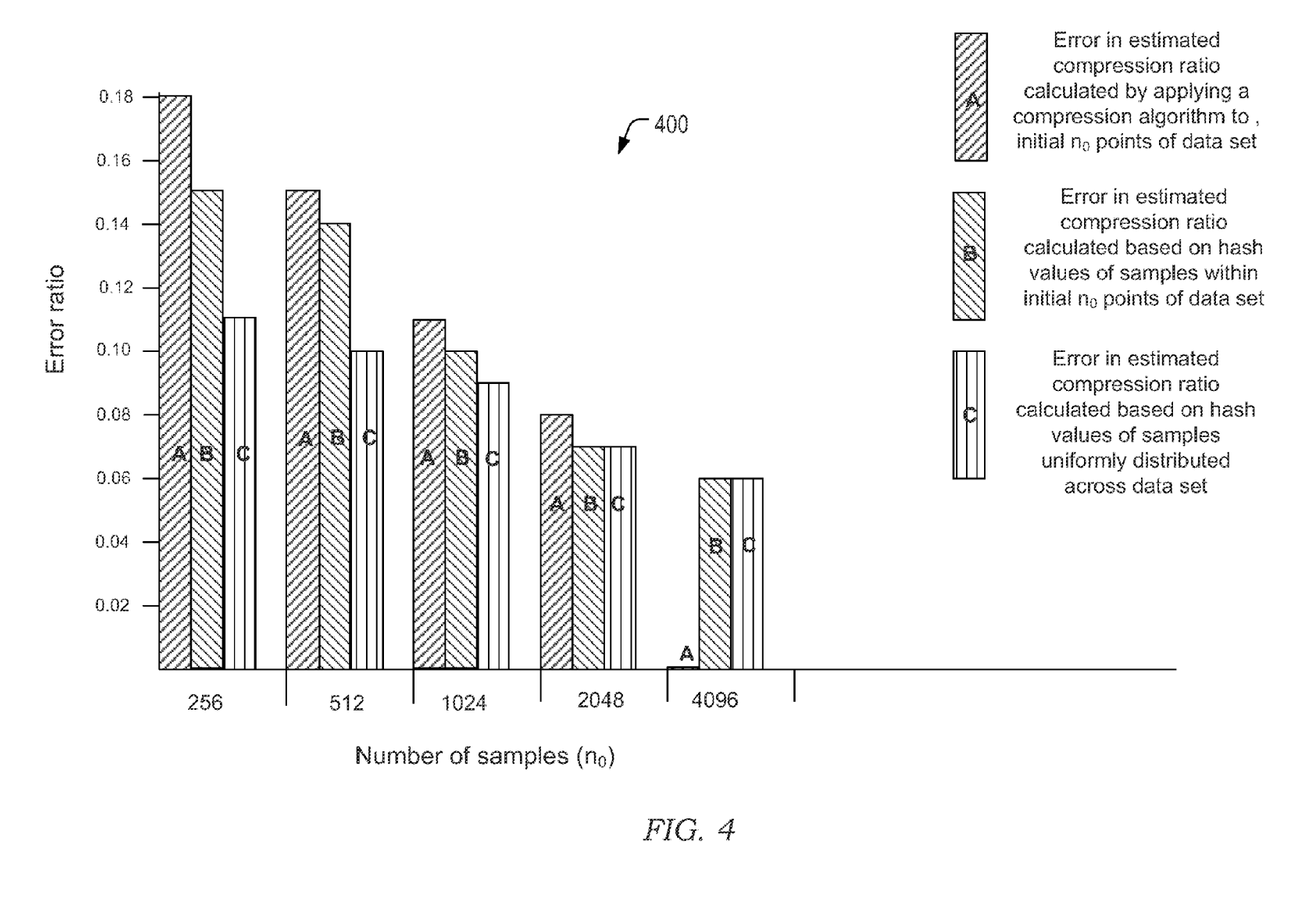
FIG. 4 is a bar graph illustrating a comparison of error in estimated compression ratios for three distinct methods of determining the estimated compression ratio.

FIG. 4 shows an illustrative embodiment of a bar graph 400 comparing error ratios associated with estimated compression ratio that is calculated by various methods. An error ratio is determined by dividing an estimated compression ratio by a compression ratio calculated from an entire data set, such as the data set 102 of FIG. 1 and FIG. 2. That is, $$\text{Error ratio} = \frac{|(\text{compression ratio of data set}) - (\text{estimated compression ratio})|}{(\text{compression ratio of data set})} \quad (5)$$

The bar graph 400 presents a comparison of the error ratio for each of three different methods of calculating the estimated compression ratio. The bar graph 400 also shows the error ratio versus a count of data elements in the subset of the data set, such as the subset 142 of the data set 102 of FIG. 1. In the bar graph 400 depicted in FIG. 4, the data set has a count of 4,096 data elements. The subset of the data set may include fewer data elements than the count of data elements in the data set. For example, as depicted in the bar graph 400, the subset of the data set may include 256 data elements, 512 elements, 1,024 elements, or 2048 elements. Alternatively, the entire data set, including all of the 4,096 data elements of the data set, may be used to determine the error ratio. The bar graph 400 shows an error ratio for $n_0$=256, 512, 1024, 2048, and 4096.

A first method (A) selects the subset of the data elements from an initial portion of the data set, the initial portion including a count of $n_0$ data elements. The estimated compression ratio is determined by applying a compression algorithm (e.g., DEFLATE) to theses $n_0$ data elements. There is error in the estimated compression ratio as compared with the (actual) compression ratio determined using an entirety of the 4,096 data elements.

A second method (B) calculates the estimated compression ratio based on a count of collisions within no hash values derived from the initial no data elements of the data set. The $n_0$ hash values are determined by a hash value generator, such as the hash value generator 216 of FIG. 2, and may be determined from a hash generating function such as the hash generating function (4) above by using samples of the data set selected from the initial data elements no. The estimated compression ratio may be calculated based on a count of collisions within the no hash values.

A third method (C) forms the subset of the data set by selecting $n_0$ data elements that are uniformly spaced along an entirety of the data set, as in FIG. 3. Based on the $n_0$ data elements selected, a total of $n_0$ hash values are calculated, each of the hash values associated with a corresponding data element. The estimated compression ratio is calculated based on a count of collisions within the $n_0$ hash values.

The bar graph 400 illustrates that method C results in smaller errors in the estimated compression ratio than either of methods A or B for a subset size of 256, 512, 1024, or 2048 data elements. That is, method C selects data elements of the subset of the data set uniformly across the entirety of the data set, resulting in a smaller error in the estimated compression ratio than by forming the subset of the data set only from the initial $n_0$ data elements of the data set (methods A and B). Further, the bar graph 400 shows that the larger the sample size of the subset, the smaller the error in the estimated compression ratio in comparison to the compression ratio calculated from all the data elements of the data set. Thus, selecting data elements of the subset uniformly across the data set results in smaller error in the estimated compression ratio than selecting the data elements of the subset from only an initial portion of the data set.

For the case in which all 4096 data elements of the data set are included in the subset, method A produces no error between the estimated compression ratio and the actual compression ratio for the entirety of the data set, since the subset of the data set is the same as the data set. For this subset, methods B and C result in some error because the estimated compression ratio is based on hash values of the data elements rather than based directly upon the data elements of the subset.

Figure 5:
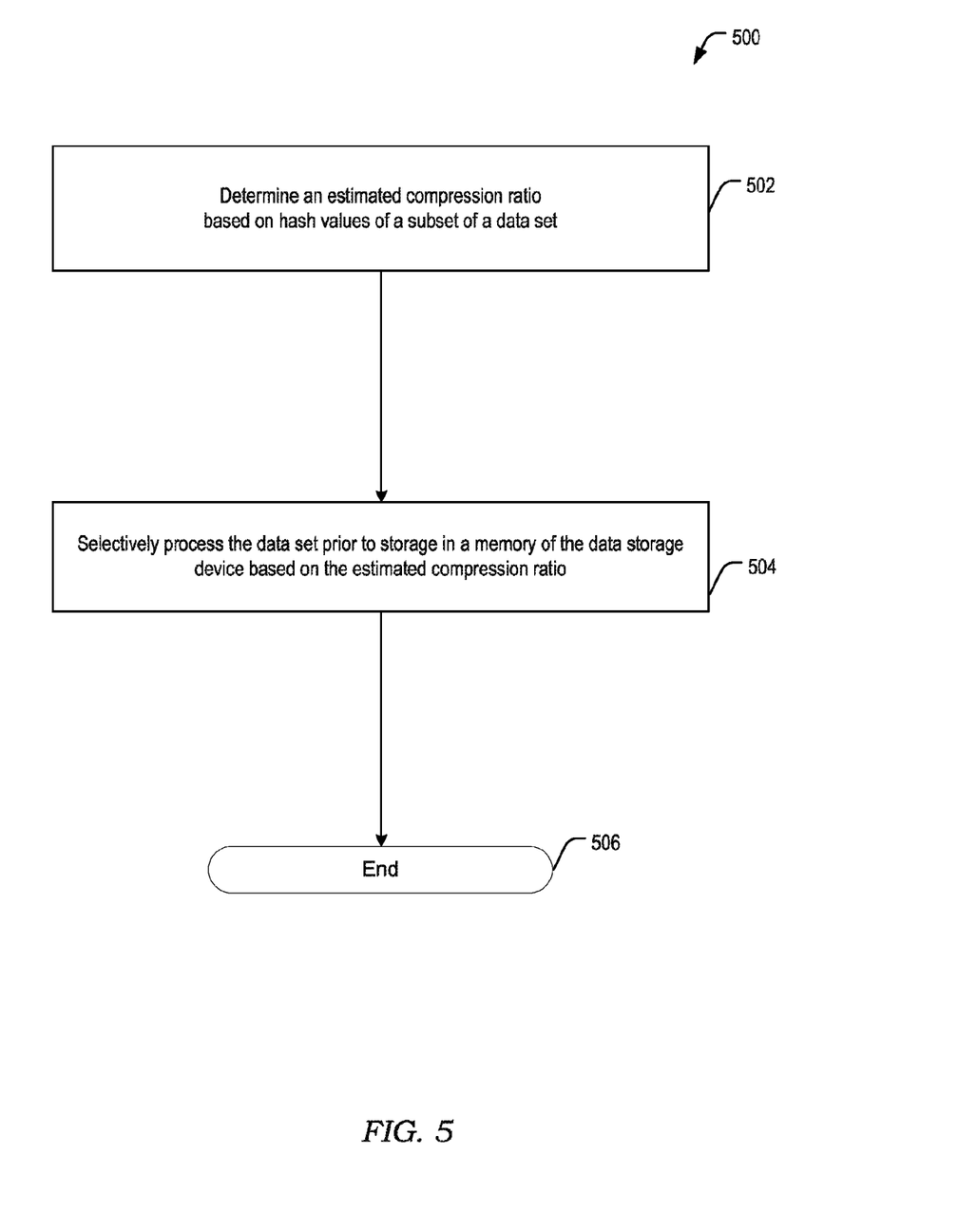
FIG. 5 is a flow chart of a particular embodiment of a method of processing a data set, where the processing is determined based on an estimated compression ratio.

FIG. 5 depicts a flow diagram of a method 500 of processing a data set prior to storage in a memory of a data storage device. An estimated compression ratio is determined that is associated with applying compression to the data set, at 502. The estimated compression ratio is based on hash values of a subset of the data set. For example, the subset may include fewer data elements than a count of data elements in the data set. The data set may be processed prior to storage in a memory of a data storage device and the processing is determined based on the estimated compression ratio, at 504. For example, processing may be determined to include data compression prior to error encoding, or processing may include performing error correction code encoding prior to storage in the data storage device without compressing the data set prior to performing the error correction code encoding. The method ends at 506.

The method 500 may optionally include determining whether to initiate a compression operation of the data set at a compressor of the data storage device based on comparing the estimated compression ratio to a threshold value. For example, the determination of whether to initiate the compression operation may be performed at the comparator and switch 220 of FIG. 2. A determination to initiate the compression operation may be made in response to the estimated compression ratio being less than the threshold value. A determination to refrain from initiating the compression operation may be made in response to the compression ratio satisfying the threshold value. The method 500 may also include selecting, based on the estimated compression ratio, a type of error correction code encoding to apply to a representation of the data set.

The estimated compression ratio may be determined based on a count of collisions of hash values associated with each data element included in the subset of the data set. For example, the estimated compression ratio may be based on a comparison of the count of collisions of hash values, determined by the hash value collision counters 232 of FIG. 2, to an expected number of collisions of hash values based on a uniform distribution of data values within the data set.

The hash values may be generated by hash circuitry. For example, the hash values may be generated by the hash value generator 216 of FIG. 2. In a particular embodiment, each hash value is determined from a corresponding sample of the data set, each sample including not more than three data elements. For example, each sample may include three consecutive data elements of the data set, as in FIG. 3.

Initiating the compression operation may include generating additional hash values of the data set at the hash circuitry. For example, the additional hash values may correspond to data elements of the data set that are not included in the subset of the data set. In an example, the additional hash values may be generated by the hash value generator 216 of FIG. 2.

Determining the estimated compression ratio based upon calculated hash values of a portion of a data set can be more time efficient, and less computation intensive, than determining the estimated compression ratio directly from the data set or a portion thereof, and can reduce the time expended to determine whether to apply compression to the data set prior to storage of a representation of the data set in a memory. Basing the estimated compression ratio on hash values of a subset of the data set, instead of the entire data set, may further reduce computing time and computing resources needed to make the determination as to whether or not to compress the data. Forming the portion of the data set from data selected uniformly across the data set may result in a more accurate estimated compression ratio than calculating the estimated compression ratio based upon an initial portion of the data set.

Although various components depicted herein are illustrated as block components and described in general terms, such components may include one or more microprocessors, state machines, or other circuits configured to enable the controller 110 of FIG. 1 and FIG. 2 to perform the particular functions attributed to such components, or any combination thereof. For example, the compression ratio estimator 140 may represent one or more physical components, such as hardware controllers, state machines, logic circuits, or other structures, to enable the controller 110 of FIG. 2 to generate hash values, count collisions of the hash values, and/or calculate an estimated compression ratio.

For example, the compression ratio estimator 140 may be implemented using a microprocessor or microcontroller programmed to determine the hash values associated with the data elements of the subset 142 of the data set 102. In a particular embodiment, the hash value generator 216 includes executable instructions that are executed by a processor and the instructions are stored at the memory 108 of FIG. 1. Alternatively, or in addition, executable instructions that are executed by processing hardware included in the compression ratio estimator 140 may be stored at a separate memory location that is not part of the memory 108, such as at a read-only memory (ROM) (not shown).

In a particular embodiment, the data storage device 106 may be implemented in a portable device configured to be selectively coupled to one or more external devices. However, in other embodiments, the data storage device 106 may be attached to or embedded within one or more host devices, such as within a housing of a host communication device. For example, the data storage device 106 may be within a packaged apparatus such as a wireless telephone, a personal digital assistant (PDA), a gaming device or console, a portable navigation device, or other device that uses internal non-volatile memory. In a particular embodiment, the data storage device 106 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a memory configured to store a data set, the data set including a first plurality of data elements; and
processing hardware coupled to the memory and configured to:
identify a first set of data elements of the data set, wherein the first set of data elements is a subset of the data set and is distinct from a second set of data elements of the data set, wherein data elements of the second set are interspersed among data elements of the first set;
generate multiple hash values for the first set of data elements; and
determine an estimated compression ratio based on the multiple hash values.

2. The data storage device of claim 1, further comprising a compressor, wherein the processing hardware is further configured to determine, based on comparing the estimated compression ratio to a threshold value, whether to initiate a compression operation of the data set at the compressor and to determine a type of compression to apply to the data set based on the estimated compression ratio.

3. The data storage device of claim 1, wherein a data element of the second set is positioned between first and second data elements of the first set.

4. The data storage device of claim 1, wherein the processing hardware is further configured to select an error correction code encoding scheme based on the estimated compression ratio.

5. A data storage device comprising:
a memory; and
processing hardware coupled to the memory and configured to:
determine an estimated compression ratio of data to be stored in the memory based on identifying first data elements that are interspersed with second data elements;
select an error correction code encoding scheme based on the estimated compression ratio;
generate encoded data by applying the error correction code encoding scheme to the data or to a compressed version of the data; and
store the encoded data in the memory.

6. The data storage device of claim 5, wherein the processing hardware is further configured to, prior to applying the error correction code encoding scheme to the compressed version of the data:
perform a comparison between the estimated compression ratio and a threshold value; and
compress the data to generate the compressed version of the data in response to the estimated compression ratio being less than the threshold value.

7. The data storage device of claim 5, wherein the processing hardware is further configured to, prior to compressing the data to generate the compressed version of the data:
divide the data into a plurality of data elements;
select a subset of data elements from the plurality of data elements; and
estimate the compression ratio based on the selected subset of data elements.

8. The data storage device of claim 7, wherein the processing hardware is further configured to estimate the compression ratio based on the selected subset of data elements by:
generating a number of hash values for the selected subset of data elements;
determining a number of distinct hash values generated based on the selected subset of data elements;
identifying an expected number of distinct hash values; and
estimating the compression ratio as a function of a ratio of the number of distinct hash values and the expected number of distinct hash values.

9. The data storage device of claim 7, wherein the processing hardware is further configured to estimate the compression ratio based on the subset of data elements by:
generating a number of hash values from the selected subset of data elements;
determining a number of collisions based on multiple hash values generated based on the subset of data elements; and
accessing a lookup table that includes multiple estimated compression ratios, wherein the estimated compression ratio is determined from the multiple estimated compression ratios of the lookup table based on the number of collisions.

10. The data storage device of claim 5, further comprising an error correction code encoder configured to select the error correction code encoding scheme from multiple error correction code encoding schemes in response to the error correction code encoder receiving the estimated compression ratio, wherein each error correction code encoding scheme of the multiple error correction code encoding schemes corresponds to a different compression algorithm of a plurality of compression algorithms.

11. The data storage device of claim 5, wherein the processing hardware is further configured to:
generate multiple hash values for data to be stored in the memory;
determine the estimated compression ratio based on the multiple hash values; and
after the estimated compression ratio is determined, compress the data to generate the compressed data.

12. A method comprising:
in a data storage device, performing:
identifying a first set of data elements of a data set, wherein the first set of data elements is a subset of the data set and is distinct from a second set of data elements of the data set, and wherein data elements of the second set are interspersed among data elements of the first set;

generating multiple hash values for the first set of data elements; and determining an estimated compression ratio based on the multiple hash values.

13. The method of claim 12, further comprising determining whether to initiate a compression operation of the data set at a compressor of the data storage device based on comparing the estimated compression ratio to a threshold value.

14. The method of claim 13, further comprising determining to initiate the compression operation in response to the estimated compression ratio being less than the threshold value.

15. The method of claim 12, further comprising selecting, based on the estimated compression ratio, a type of error correction code encoding scheme to apply to a representation of the data set.

16. The method of claim 12, wherein the estimated compression ratio is determined based on a count of collisions of the multiple hash values or based on a number of distinct values of the multiple hash values.

17. The method of claim 12, wherein the estimated compression ratio is determined based on a comparison of a count of collisions of the multiple hash values to an expected number of collisions, and wherein a collision occurs when a first hash value of the multiple hash values has the same value as a second hash value of the multiple hash values.

18. The method of claim 12, further comprising, after determining the estimated compression ratio, generating at least one hash value for a group of data elements of the second set of data elements.

19. The method of claim 12, further comprising:
determining a number of distinct hash values included in the multiple hash values or determining a count of collisions of the multiple hash values; and accessing a lookup table that includes multiple estimated compression ratios, wherein the estimated compression ratio is determined from the multiple estimated compression ratios of the lookup table based on the number of distinct hash values or the count of collisions of the multiple hash values.

20. The method of claim 12, wherein the estimated compression ratio is determined without generating a hash value for the second set of data elements.

* * * * *